(12) United States Patent
Nishi et al.

(10) Patent No.: US 11,365,353 B2
(45) Date of Patent: Jun. 21, 2022

(54) BLACK LIQUID-CRYSTAL POLYMER FILM AND MULTILAYER BOARD

(71) Applicant: Murata Manufacturing Co., Ltd., Nagaokakyo (JP)

(72) Inventors: Yoshimasa Nishi, Nagaokakyo (JP); Sunao Fukutake, Nagaokakyo (JP); Akira Moriya, Nagaokakyo (JP); Kanto Iida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 111 days.

(21) Appl. No.: 16/431,908

(22) Filed: Jun. 5, 2019

(65) Prior Publication Data

US 2019/0352565 A1 Nov. 21, 2019

Related U.S. Application Data

(63) Continuation of application No. PCT/JP2017/043698, filed on Dec. 5, 2017.

(30) Foreign Application Priority Data

Dec. 5, 2016 (JP) .............................. JP2016-236266

(51) Int. Cl.
| | |
|---|---|
| *G02F 1/1333* | (2006.01) |
| *C09K 19/30* | (2006.01) |
| *C09K 19/02* | (2006.01) |
| *C09K 19/38* | (2006.01) |
| *H05K 1/09* | (2006.01) |

(52) U.S. Cl.
CPC .......... *C09K 19/3066* (2013.01); *C09K 19/02* (2013.01); *C09K 19/3809* (2013.01); *H05K 1/095* (2013.01); *C09K 2219/03* (2013.01); *H05K 2201/0141* (2013.01); *H05K 2201/0145* (2013.01); *H05K 2201/0179* (2013.01); *H05K 2201/0191* (2013.01); *H05K 2201/0195* (2013.01); *H05K 2201/0209* (2013.01); *H05K 2201/0355* (2013.01)

(58) Field of Classification Search
CPC ................ C09K 19/3066; C09K 19/02; C09K 19/3809; C09K 19/38; C09K 2019/521; C09K 2219/03
See application file for complete search history.

(56) References Cited

U.S. PATENT DOCUMENTS

| | | | |
|---|---|---|---|
| 6,761,834 B2 * | 7/2004 | St. Lawrence ............. | C08J 5/18 252/299.01 |
| 7,323,238 B2 | 1/2008 | Kondo et al. | |
| 9,947,433 B2 | 4/2018 | Fujino et al. | |
| 2006/0068180 A1 | 3/2006 | Kondo et al. | |
| 2014/0011011 A1 | 1/2014 | Fujino et al. | |

FOREIGN PATENT DOCUMENTS

| | | |
|---|---|---|
| JP | 2006093438 A | 4/2006 |
| JP | 2006299254 A | 11/2006 |
| JP | 2007147880 A | 6/2007 |
| JP | 2009179763 A | 8/2009 |
| JP | 2013194225 A | 9/2013 |
| JP | 2013199599 A | 10/2013 |
| WO | 2012131829 A1 | 10/2012 |

OTHER PUBLICATIONS

International Search Report issued in PCT/JP2017/043698, dated Feb. 27, 2018.
Written Opinion of the International Searching Authority issued in PCT/JP2017/043698, dated Feb. 27, 2018.

* cited by examiner

*Primary Examiner* — Geraldina Visconti
(74) *Attorney, Agent, or Firm* — ArentFox Schiff LLP

(57) ABSTRACT

A black liquid-crystal polymer film that contains a black pigment and a liquid crystal polymer and the black liquid-crystal polymer film has a lightness of 45 or less, a dielectric loss tangent of 0.0035 or less, a minimum dielectric breakdown strength of 60 kV/mm or more, and a maximum-to-minimum ratio of in-plane thermal linear expansion coefficient in the range of 1.0 to 2.5.

21 Claims, 7 Drawing Sheets

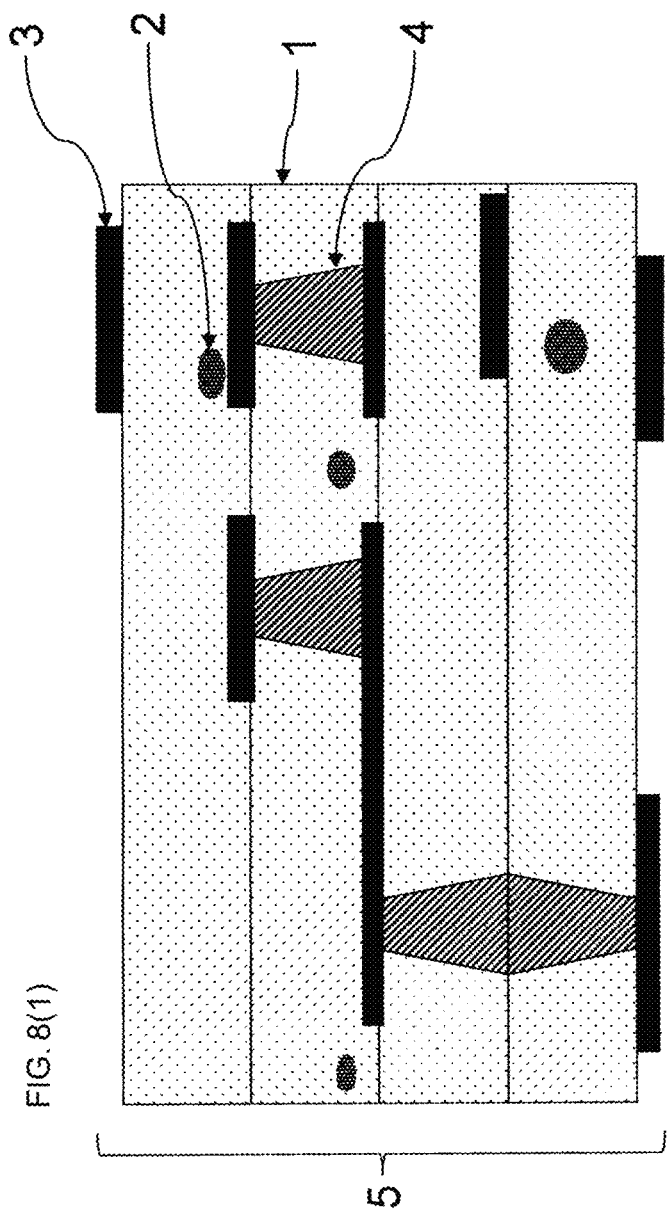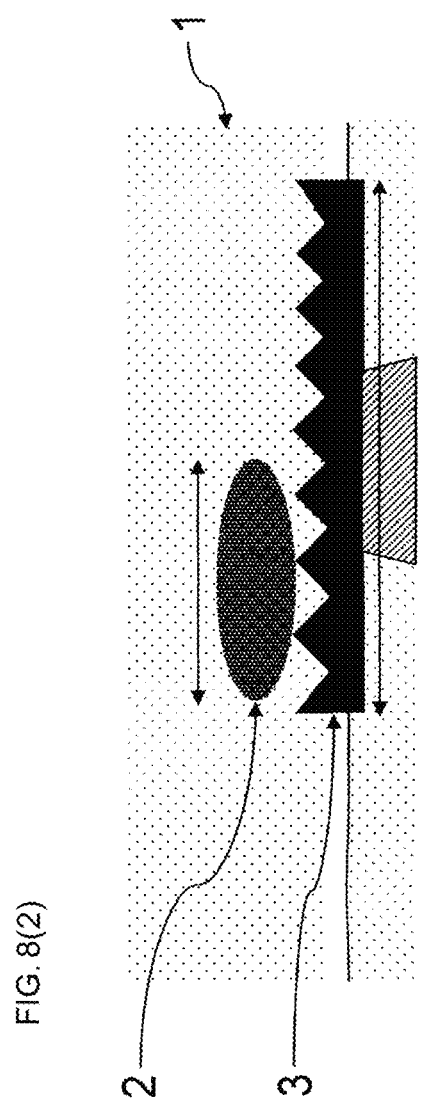
FIG. 8(1)
FIG. 8(2)

BLACK LIQUID-CRYSTAL POLYMER FILM AND MULTILAYER BOARD

CROSS REFERENCE TO RELATED APPLICATIONS

The present application is a continuation of International application No. PCT/JP2017/043698, filed Dec. 5, 2017, which claims priority to Japanese Patent Application No. 2016-236266, filed Dec. 5, 2016, the entire contents of each of which are incorporated herein by reference.

FIELD OF THE INVENTION

The present invention relates to a black liquid-crystal polymer film that has a significantly decreased number of high-concentration spots of a black pigment irrespective of its black color, and a laminated sheet, an electronic circuit board, and a multilayer board each including the black liquid-crystal polymer film.

BACKGROUND OF THE INVENTION

In recent years, there has been a demand for further size and weight reduction of electronic equipment and accordingly a demand for a still higher packaging density of electronic circuit boards. With increasing information traffic, there has also been a demand for applications in a high-frequency band. More specifically, high-frequency signals in GHz bands and millimeter-wave bands, which have mainly be utilized in applications such as radar and satellite communications, have recently been utilized in portable terminals, such as smartphones and tablet computers. When electrical signals pass through an electronic circuit board, however, molecules in the insulating substrate of the electronic circuit board are polarized by the voltage and absorb part of signal energy, thereby attenuating the signals. Such a phenomenon is more noticeable in high-speed transmission. Energy stored in a dielectric material increases with the relative permittivity of the insulating substrate, and the electric current to be absorbed increases with the dielectric loss tangent of the insulating substrate. The dielectric loss is proportional to the product of the frequency of the signal, the square root of relative permittivity, and the dielectric loss tangent. Thus, there is a demand for a material with both a low relative permittivity and a low dielectric loss tangent. Due to their low relative permittivity and low dielectric loss tangent as well as high flexibility, liquid-crystal polymer films attract attention as insulating substrates for high-speed transmission.

Due to their pale yellowish-white color tone, however, liquid-crystal polymer films have problems in the automated optical inspection (AOI) for inspecting an electronic circuit board for the pattern shape. More specifically, AOI includes image processing of an image of a circuit surface taken with a camera, measurement of reflected light of laser irradiation, or inspection of X-ray transmission dose. Because metals constituting a circuit reflect light, the circuit pattern is more clearly recognized when a portion of an insulating substrate on which no circuit is formed has a lower reflectance. However, liquid-crystal polymer films have higher optical reflectances than other resin films, and this results in an indistinct boundary between the metal circuit pattern and the liquid-crystal polymer substrate. Thus, electronic circuit boards with a liquid-crystal polymer film have low circuit pattern recognition accuracy. Furthermore, an optical device mounted on an electronic circuit board including a liquid-crystal polymer film may lose its function or may cause a malfunction due to stray light from the liquid-crystal polymer film.

To decrease the reflectance, therefore, a film has been studied that contains a colorant, such as carbon black, dispersed in a liquid crystal polymer.

For example, Patent Document 1 discloses a printed circuit board including a colored thermoplastic resin film on a land forming face so as to increase the difference in optical reflectance from the electrode land and also discloses a printed circuit board including a colored thermoplastic resin film having an opening through which at least part of a land is exposed, wherein the thermoplastic resin film may be a liquid-crystal polymer film, and a pigment for coloring the thermoplastic resin film may be carbon black.

However, a liquid crystal polymer is an organic polymer, which has a low affinity for an inorganic pigment carbon black. Thus, it is very difficult to disperse carbon black particles in a liquid-crystal polymer film. Nevertheless, Patent Document 1 does not describe a method for mixing a liquid crystal polymer with carbon black.

Patent Document 2 discloses a thermoplastic resin composition containing 0.1 to 20 parts by weight of carbon black per 100 parts by weight of a thermoplastic resin, wherein carbon black dispersed has a maximum particle size of 50 μm or less.

PTL 1: Japanese Unexamined Patent Application Publication No. 2006-93438
PTL 2: International Publication WO 2012/131829

SUMMARY OF THE INVENTION

As described above, coloring of a liquid-crystal polymer film has been studied to improve the pattern recognition accuracy in the pattern shape inspection of an electronic circuit board including a liquid-crystal polymer film as an insulating substrate.

However, inorganic pigments, such as carbon black, tend to aggregate in a liquid-crystal polymer film due to their low affinity, and the amount of pigment must be increased to make a difference in reflectance between the liquid-crystal polymer film and a metal circuit pattern. This impairs the dielectric properties of the liquid-crystal polymer film.

Patent Document 2 discloses a composition containing carbon black dispersed in a thermoplastic resin. However, the present inventors experimentally found that in a mixture of a liquid crystal polymer and carbon black, even if carbon black does not aggregate, a spot containing a high concentration of carbon black is formed in the liquid-crystal polymer film (see FIG. 5), probably due to a flow characteristic of the liquid crystal polymer, that is, very high shear rate dependency of melt viscosity. Such a high-concentration spot is formed probably because a portion initially containing a high concentration of carbon black in a mixture of a liquid crystal polymer and carbon black has a lower shear rate than its surrounding portion and thereby has an increased viscosity, thus becoming difficult to disperse. Unlike known carbon black aggregates, the spot is a mixture of a liquid crystal polymer and carbon black particles, containing a high concentration of carbon black particles. The spot in FIG. 5 extending through a liquid-crystal polymer film in the thickness direction has a resistance of 2 kΩ, which is higher than the resistance of carbon black itself. Thus, the spot is distinctly different from carbon black aggregates. The present inventors have found that such a spot is responsible for an increased dielectric loss tangent of a liquid-crystal polymer film without contributing to a decrease in lightness by the addition of carbon black and is responsible for a decreased dielectric breakdown strength of a thin liquid-crystal polymer film.

Accordingly, it is an object of the present invention to provide a black liquid-crystal polymer film that is black due to a sufficient amount of black pigment, is distinctly different in optical reflectance from metal foil, has a significantly decreased number of high-concentration spots of the black pigment, and has good dielectric properties and insulating properties, as well as a laminated sheet, an electronic circuit board, and a multilayer board, each including the black liquid-crystal polymer film and having the same characteristics.

The present inventors have made extensive studies to solve the above problems. As a result, the present inventors have completed the present invention by finding that in the formation of a film by extrusion of a mixture of a molten liquid crystal polymer and a black pigment, the formation of high-concentration spots of the black pigment in the film can be significantly reduced by passing the mixture through a filter with a specified pore size, and a liquid-crystal polymer film thus formed contains a relatively large amount of black pigment, has a low dielectric loss tangent irrespective of its low lightness, and has a high dielectric breakdown strength.

In one aspect, the present invention is directed to a black liquid-crystal polymer film containing a black pigment and a liquid crystal polymer, wherein the black liquid-crystal polymer film has a lightness of 45 or less, a dielectric loss tangent of 0.0035 or less, a minimum dielectric breakdown strength of 60 kV/mm or more, and a maximum-to-minimum ratio of in-plane thermal linear expansion coefficient in the range of 1.0 to 2.5.

In a second aspect, the present invention is directed to a black liquid-crystal polymer film containing a black pigment and a liquid crystal polymer, wherein the number density of high-concentration spots of the black pigment with a size in the range of 3/10 to 9/10 of the film thickness is 15/342 mm$^2$ or less.

The black liquid-crystal polymer film preferably has a relative permittivity of 3.5 or less.

The black liquid-crystal polymer film also preferably has a thickness in the range of 10 to 75 μm.

The black liquid-crystal polymer film preferably has a high-concentration spot of the black pigment has a size of 9/10 or less of the film thickness.

The black liquid-crystal polymer film also preferably has a thermal linear expansion coefficient in the range of 3 to 30 ppm/° C.

The black liquid-crystal polymer film is preferably a long film.

Another aspect of the present invention is directed to a laminated sheet having a metal foil on one or both faces of the black liquid-crystal polymer film according to the above configurations.

A further aspect of the present invention is directed to an electronic circuit board including a circuit on the metal foil of the laminated sheet according noted above.

In a further aspect, the present invention is directed to a multilayer board including two or more electronic circuit boards, wherein the electronic circuit boards have a metal foil on one or both faces of a black liquid-crystal polymer film with a circuit being formed on the metal foil, the black liquid-crystal polymer film contains a black pigment and a liquid crystal polymer, and the black liquid-crystal polymer film has a lightness of 45 or less, the black liquid-crystal polymer film has a dielectric loss tangent of 0.0035 or less, and the black liquid-crystal polymer film has a minimum dielectric breakdown strength of 60 kV/mm or more.

In a still further aspect, the present invention is directed to a multilayer board including two or more electronic circuit boards, wherein the electronic circuit boards have a metal foil on one or both faces of a black liquid-crystal polymer film with a circuit being formed on the metal foil, the black liquid-crystal polymer film contains a black pigment and a liquid crystal polymer, and in a side view, in the black liquid-crystal polymer film, a number density of high-concentration spots of the black pigment with a size in the range of 3/10 to 9/10 of the shortest distance between the circuits disposed on both faces of the black liquid-crystal polymer film is 15/342 mm$^2$ or less.

In a side view of the multilayer board, in the black liquid-crystal polymer film, a high-concentration spot of the black pigment between the two circuits disposed on both faces of the black liquid-crystal polymer film has a size of 9/10 or less of the shortest distance between the circuits.

In a top view of the multilayer board a high-concentration spot of the black pigment disposed between the two circuits disposed on one face of the black liquid-crystal polymer film has a size of 9/10 or less of the shortest distance between the circuits.

In a side view of the multilayer board a high-concentration spot of the black pigment disposed directly above and/or directly under the circuit has a size of ½ or less of the minimum width of the circuit.

In the multilayer board, the black liquid-crystal polymer film preferably has a relative permittivity of 3.5 or less.

In the multilayer board, the black liquid-crystal polymer film preferably has a thickness in the range of 10 to 75 μm.

In the multilayer board, the black liquid-crystal polymer film preferably has a thermal linear expansion coefficient in the range of 3 to 30 ppm/° C.

The multilayer board preferably further includes an electronic device is mounted on the circuit.

In a further aspect, an electronic component includes a mother board and the multilayer board described above mounted on the mother board.

When used as an insulating substrate of an electronic circuit board, due to its low lightness, a liquid-crystal polymer film according to the present invention has a large difference in optical reflectance from metal foil forming a circuit and enables accurate inspection by an automated circuit pattern shape inspection method AOI. In general, however, a relatively large amount of black pigment must be added to an insulating substrate with low lightness, which results particularly in an increased dielectric loss tangent due to the formation of high-concentration spots of the black pigment. An insulating substrate with a high dielectric loss tangent has a high ratio of absorbed electric current to passing electric current and therefore cannot be used particularly as a material for high-frequency electronic circuit boards. By contrast, a liquid-crystal polymer film according to the present invention has a significantly decreased number of high-concentration spots of a black pigment irrespective of its low lightness and has good dielectric properties with a low dielectric loss tangent and good insulating properties. Thus, the present invention satisfies recent high requirements for electronic circuit boards and is industrially very useful.

BRIEF DESCRIPTION OF THE DRAWINGS

FIG. 8(1) is a schematic side view of a multilayer board according to the present invention, and FIG. 8(2) is a fragmentary enlarged view thereof.

DETAILED DESCRIPTION OF THE PREFERRED EMBODIMENTS

Figure 1:
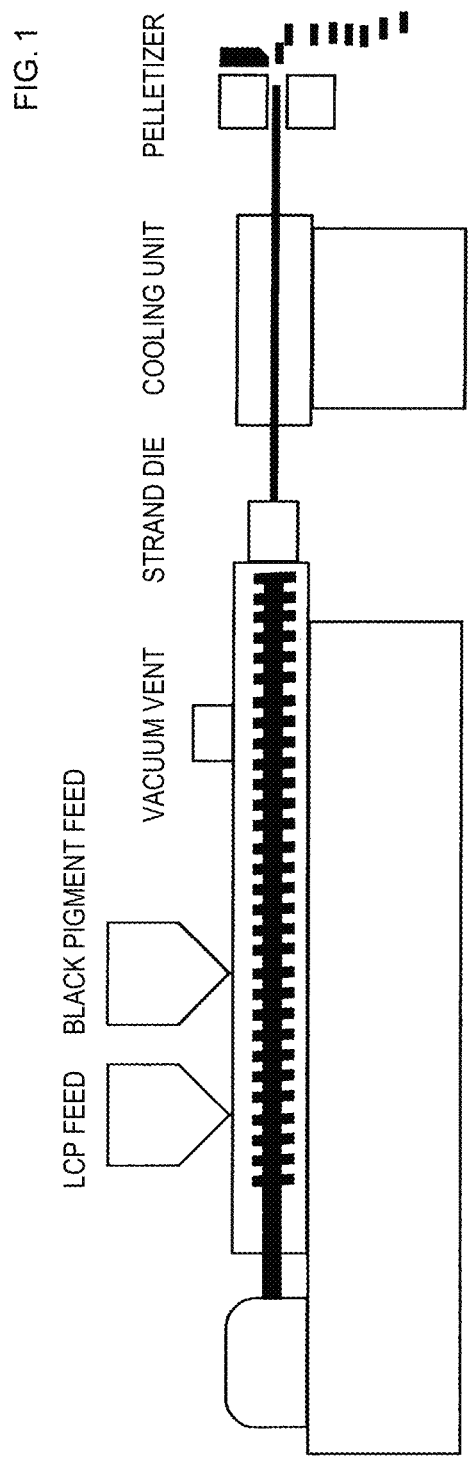
FIG. 1 is a schematic view of an embodiment of the preparation of pellets containing at least a liquid crystal polymer and a black pigment using a twin-screw extruder.

A first black liquid-crystal polymer film according to the present invention contains a black pigment and a liquid crystal polymer and has a lightness of 45 or less, a dielectric loss tangent of 0.0035 or less, a minimum dielectric breakdown strength of 60 kV/mm or more, and a maximum-to-minimum ratio of in-plane thermal linear expansion coefficient in the range of 1.0 to 2.5. A second black liquid-crystal polymer film according to the present invention contains a black pigment and a liquid crystal polymer, wherein the number density of high-concentration spots of the black pigment with a size in the range of 3/10 to 9/10 of the film thickness is 15/342 mm$^2$ or less.

The present invention relates to a black liquid-crystal polymer film. Liquid crystal polymers include thermotropic liquid crystal polymers, which have liquid crystallinity in the molten state, and lyotropic liquid crystal polymers, which have liquid crystallinity in the solution state. Although liquid crystal polymers of any type may be used in the present invention, thermotropic liquid crystal polymers are suitably used because of their thermoplasticity and better high-frequency characteristics.

Thermotropic liquid crystal polymers include thermotropic liquid crystal polyesters (hereinafter referred to simply as "liquid crystal polyesters"), which have liquid crystallinity in the molten state. Examples of thermotropic liquid crystal polyesters include aromatic polyesters, which are produced by using an aromatic hydroxycarboxylic acid as an essential monomer and by reacting the aromatic hydroxy-carboxylic acid with a monomer, such as an aromatic dicarboxylic acid or an aromatic diol. Representative liquid crystal polyesters include a type I [the following formula (1)] synthesized from para-hydroxybenzoic acid (PHB), phthalic acid, and 4,4'-biphenol, type II [the following formula (2)] synthesized from PHB and 2,6-hydroxynaphthoic acid, and type III [the following formula (3)] synthesized from PHB, terephthalic acid, and ethylene glycol.

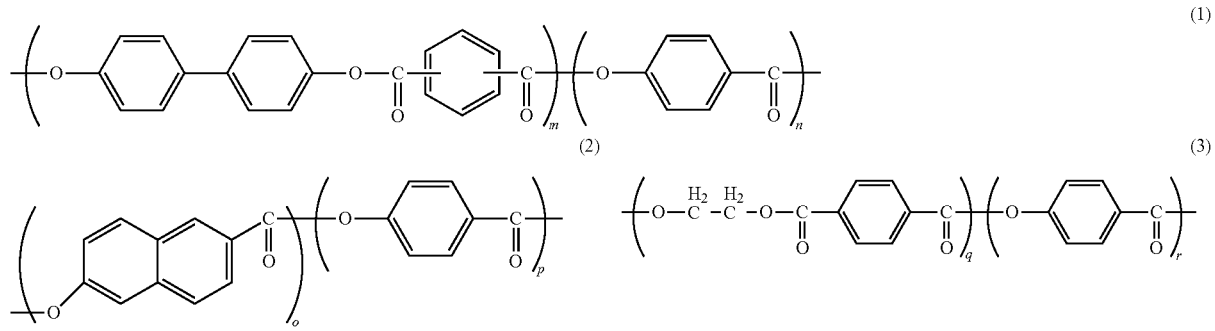

In the present invention, among these, due to their higher heat resistance and hydrolysis resistance, type I liquid crystal polyesters and type II liquid crystal polyesters are preferred, and type II liquid crystal polyesters are more preferred. In the formula (1), the phthalic acid is preferably isophthalic acid.

A black liquid-crystal polymer film according to the present invention contains a black pigment. The black pigment may be of any type and may be appropriately selected from, for example, carbon black pigments, such as carbon black and graphite; and inorganic black pigments, including metal oxide black pigments, such as triiron tetroxide, Cu—Cr composite oxides, and Cu—Cr—Zn composite oxides; and metal black pigments, such as black interference aluminum pigments. Preferably carbon black pigments, more preferably carbon black, are used from the perspective of not excessively impairing the dielectric properties of liquid crystal polymers and in terms of light absorptivity, availability, and less residues in the process of boring a hole in a substrate. Other black pigments that have the same dielectric properties as carbon black may be used. Other fillers may also be used without impairing the dielectric properties. Examples of other fillers include silica, boron nitride, and aluminum nitride. The black pigment and other fillers may have any shape, for example, spherical, plate-like, rod-like, acicular, or amorphous.

The sizes of black pigments and other fillers used in the present invention may be appropriately adjusted, for example, in the range of approximately 15 to 75 nm with respect to the average primary particle size. The average primary particle size in the present invention may be a catalog value of a product, if present. If no catalog value is available, for example, the sizes of black pigments and other fillers to be used may be determined by taking approximately 1,000- to 100,000-fold magnified photographs of the black pigments and other fillers with a scanning electron microscope, determining the equivalent circular diameters of at least 100 particles using image analysis software, and calculating the average value therefrom. The black pigments may have a specific surface area in the range of approximately 25 to 300 m$^2$/g. The specific surface area in the present invention may be a catalog value of a product, if present. If no catalog value is available, for example, the specific surface area may be determined by physical adsorption of nitrogen gas molecules on the surface of a black pigment by the low-temperature nitrogen adsorption method and by calculating the specific surface area from the amount of adsorption using the BET equation.

The present invention can significantly decrease the number of high-concentration spots of a black pigment and enables a relatively large amount of black pigment to be added to a black liquid-crystal polymer film according to the present invention without increasing the dielectric loss tangent. For example, the amount of black pigment can range from 0.1% to 5.0% by mass of the liquid crystal polymer.

A black liquid-crystal polymer film according to the present invention has low lightness due to a relatively large amount of black pigment, more specifically, a lightness (CIE1976L*) of 45 or less as measured according to JIS Z 8722. In the present invention, the lightness of a liquid-crystal polymer film can be measured with a spectrophotometer ("CM-600d" manufactured by Konica Minolta, Inc.), for example. Lightness is measured by the reflection method using an integrating sphere (8°: di) as an optical system, with a cloudy light source, and at a visual field of 2°. For a laminated sheet having a metal foil on one or both faces of a liquid-crystal polymer film, the surface of the film exposed by removing the metal foil is measured. For example, metal foil is removed by etching with an iron (III) chloride solution, and the resulting film is washed with water and is dried in a circulating oven at 80° C. for 1 hour. The lightness of a black liquid-crystal polymer film in a multilayer board can be measured after the surface of the black liquid-crystal polymer film to be measured is exposed by polishing or etching. Alternatively, when the lightness of a black liquid-crystal polymer is directly measured in a multilayer board, the lightness of a portion on which neither circuit nor interlayer connection conductor is formed on the board must be measured, and therefore a spectrophotometer with a small measurement diameter is preferably used. For example, the spectrophotometer may be CM-700d manufactured by Konica Minolta, Inc., which has a measurement diameter of 3 mm. A lightness of 45 or less results in a clear contrast between a circuit pattern portion and its surrounding liquid-crystal polymer film portion and improved pattern recognition accuracy in AOI. In general, in AOI, when the difference in lightness between a circuit pattern portion and an insulating substrate portion is less than 30, the image recognition error percent cannot be 0%. Because a circuit pattern (copper foil S face) typically has a lightness of approximately 75, an insulating substrate preferably has a lightness of 45 or less.

A black liquid-crystal polymer film according to the present invention has a decreased number of high-concentration spots of a black pigment, contains a uniformly dispersed black pigment, and has good dielectric properties irrespective of a relatively large amount of black pigment. As a matter of course, the formation of black pigment aggregates is also reduced. More specifically, the dielectric loss tangent is 0.0035 or less, preferably 0.003 or less, and the relative permittivity is 3.5 or less. In alternating current signal transmission through a circuit formed on an insulating substrate made of a dielectric material, the electric power of the signal is partly absorbed by the dielectric material, and the signal is attenuated and lost. The ratio of absorbed electric power to passing (transmitted) electric power is the dielectric loss tangent. A circuit made of a dielectric material with a small dielectric loss tangent can have a small transmission loss.

Due to their rigidity and restricted movement even under an alternating voltage, liquid crystal polymer molecules inherently have a low dielectric loss tangent and a low dielectric constant. However, the addition of a black pigment impairs the dielectric properties. The present inventors have demonstrated that the addition of a black pigment to a liquid crystal polymer forms high-concentration spots containing a high concentration of the black pigment in the liquid crystal polymer and particularly increases the dielectric loss tangent. In a liquid-crystal polymer film according to the present invention, however, the addition of a relatively large amount of black pigment does not increase the number of high-concentration spots, results in a uniformly dispersed black pigment, and does not impair the dielectric properties. In particular, a liquid-crystal polymer film according to the present invention has a low dielectric loss tangent. The relative permittivity and dielectric loss tangent can be determined, for example, by using a network analyzer, such as "ENA E5071C" manufactured by Agilent Technologies, and a resonator, such as a split post dielectric resonator manufactured by QWED with a measurement frequency of 3.18 GHz. The relative permittivity can be calculated from the difference in resonant frequency between a resonator alone and the resonator including a test specimen. The dielectric loss tangent can be calculated from the difference in Q-value and the difference in resonant frequency between a resonator alone and the resonator including a test specimen. The relative permittivity and dielectric loss tangent of a black liquid-crystal polymer film in a laminated sheet, an electronic circuit board, and a multilayer board can also be measured. When a sample of a sufficient size is not available, the relative permittivity and dielectric loss tangent may be measured at a high frequency of 60 GHz, for example. The relative permittivity and dielectric loss tangent in a measurement area 5 mm in diameter without a circuit or an interlayer connection conductor can be measured at a high frequency of 60 GHz.

A black liquid-crystal polymer film according to the present invention has a significantly decreased number of high-concentration spots of a black pigment as described above and has good insulating properties even with a small thickness. For example, before a black liquid-crystal polymer film of a desired size is cut out, a maximum number of 10 cm×10 cm test specimens are cut from the center of the whole film in the width direction, and a maximum number of test specimens are also cut in the same manner in the width direction in the longitudinally contiguous portions. The breakdown voltage of each of 100 or more test specimens thus prepared is measured and is divided by the thickness of the film to determine the dielectric breakdown strength. For example, 11 test specimens can be prepared from a whole film 110 cm in width in the width direction, and 11 test specimens are also cut in the same manner in the width direction in each longitudinally contiguous portion. Thus, 100 or more test specimens are prepared. In the present invention, the minimum dielectric breakdown strength is preferably 60 kV/mm or more, more preferably 100 kV/mm or more. To prevent interlayer insulation failure, preferably, there is no short circuit that is conductive even at a low voltage of approximately 20 V. The breakdown voltage can be measured with a withstand voltage tester, for example. When a sample of a sufficient size cannot be taken from a laminated sheet, an electronic circuit board, or a multilayer board, the measurement may be performed with a terminal 1 mm in diameter, for example. The terminal 1 mm in diameter may be a copper wire 1 mm in diameter with a cross section being flatly cut. When a terminal 1 mm in diameter is used, the dielectric breakdown strength can be measured in a region 3 mm or more in diameter without a circuit or an interlayer connection conductor.

Liquid crystal polymer molecules can align very easily due to their rigidity and long chemical structures. Anisotropic films in which liquid crystal polymer molecules align in a particular direction are difficult to treat because the anisotropic films are torn easily in the alignment direction. Furthermore, anisotropic films have low dimensional accuracy and vary greatly in thermal stress, mechanical strength, and relative permittivity. Furthermore, when a metal foil is placed on an anisotropic film to form a laminated sheet, warping due to the anisotropy of the film occurs in the laminated sheet, and the laminated sheet cannot be used as an insulating substrate of an electronic circuit board. By contrast, a black liquid-crystal polymer film according to the present invention has controlled molecular orientation and is isotropic. More specifically, the maximum-to-minimum ratio of in-plane thermal linear expansion coefficient ranges from 1.0 to 2.5. The ratio is preferably 2.0 or less, more preferably 1.8 or less, still more preferably 1.5 or less.

In the present invention, the minimum and maximum thermal linear expansion coefficients are the minimum measured value and the maximum measured value of 6 thermal linear expansion coefficients measured at intervals of 30 degrees in the circumferential direction on the surface of a liquid-crystal polymer film.

In the melt extrusion of a liquid-crystal polymer film, a film extruded from an extruder is strongly oriented in the machine direction (MD). In the present invention, when a liquid-crystal polymer film used in a circuit board is strongly oriented in one direction, the thermal linear expansion coefficient in the direction (TD) perpendicular to the machine direction is different from that in MD, and the laminated sheet is more warped in TD or MD. A multilayer board including such a laminated sheet is also more warped and is difficult to use as a circuit board. Thus, preferably, a film extruded from an extruder is uniaxially stretched only in TD or biaxially stretched in MD and TD with a higher stretch ratio in TD to decrease the anisotropy of the liquid crystal polymer molecules and make the film isotropic. The stretch ratios may be adjusted to equalize the thermal linear expansion coefficient in TD with the thermal linear expansion coefficient in MD. This makes the liquid-crystal polymer film completely isotropic, and the maximum-to-minimum ratio of thermal linear expansion coefficient is 1.0.

A black liquid-crystal polymer film according to the present invention preferably has an in-plane thermal linear expansion coefficient in the range of 3 to 30 ppm/° C. As described above, the maximum-to-minimum ratio of in-plane thermal linear expansion coefficient of a liquid-crystal polymer film preferably ranges from 1.0 to 2.5. The thermal linear expansion coefficient can be determined by a thermomechanical analysis method (TMA method). For example, a thermomechanical analyzer, such as Q400 manufactured by TA Instruments, is used. In accordance with JIS C 6481, the sample shape is 4 mm in width, the distance between the grips is 15 mm, the load is 0.1 N, and the temperature is increased from normal temperature to 170° C. at a heating rate of 40° C./min, is held at 170° C. for 1 minute, and is decreased from 170° C. to normal temperature at a cooling rate of 10° C./min. The change ΔL in the distance between the grips is measured while the temperature is decreased from 100° C. to 50° C. The thermal linear expansion coefficient is calculated using the distance between the grips L=15 mm and the temperature difference ΔT=50° C.

The thermal linear expansion coefficient can be controlled within the above range to certainly decrease anisotropy in in-plane thermal stress, mechanical strength, and relative permittivity. This also certainly decreases the warping of a laminated sheet and improves dimensional stability, thus providing a good material for an electronic circuit board. For example, a laminated sheet including a metal foil on one face of a liquid-crystal polymer film can have a curvature of 10% or less. The "curvature" can be determined according to JIS C 6481 and, more specifically, refers to the percentage determined by placing a film on a horizontal table such that the center of the film is in contact with the table and the four corners are separated from the table, measuring the distance of each corner from the table, and dividing the maximum distance by the length of a side of the film. Because a large difference between the thermal linear expansion coefficient of the liquid-crystal polymer film and the thermal linear expansion coefficient of the metal foil tends to result in warping of the laminated sheet, the thermal linear expansion coefficients of the liquid-crystal polymer film and the metal foil are preferably adjusted to be almost identical. The thermal linear expansion coefficient of the liquid-crystal polymer film can be adjusted by film extrusion conditions or by stretching.

A black liquid-crystal polymer film according to the present invention preferably has high dimensional stability. The dimensional stability can be represented by the rate of dimensional change. More specifically, in accordance with JIS C 6471, a metal foil is bonded to a liquid-crystal polymer film, the metal foil is then completely etched with an iron (III) chloride aqueous solution, the liquid-crystal polymer film is washed with water and is dried in a circulating oven at 80° C. for 30 minutes, and the percentage of change between the dimensions before etching and the dimensions after drying is determined. A liquid-crystal polymer film for use in the present invention preferably has a dimensional change rate in the range of −0.1% to 0.1%.

A black liquid-crystal polymer film in the present invention has an appropriately controlled thickness, preferably in the range of 10 to 75 μm. A black liquid-crystal polymer film with a thickness of 10 μm or more can have sufficient strength and insulating properties as an insulation film of an electronic circuit board. A black liquid-crystal polymer film with a thickness of 75 μm or less is compact and is applicable to miniaturized electronic equipment. The thickness is preferably 13 μm or more, more preferably 20 μm or more, preferably 50 μm or less, more preferably 25 μm or less. A decrease in the thickness of the film results in increased flexibility, enables miniaturization of a multilayer electronic circuit board, and enables an electronic circuit board to be used in small electronic equipment.

A black liquid-crystal polymer film according to the present invention has a decreased number of high-concentration spots of a black pigment. In a liquid crystal polymer, black pigment particles tend to aggregate by van der Waals force and form aggregates. Thus, the black pigment aggregates are secondary particles composed of primary particles of the black pigment. However, the present inventors have found that even if the formation of black pigment secondary particles in a liquid crystal polymer is reduced, high-concentration spots of the black pigment larger than the secondary particles are sometimes formed locally. Such high-concentration spots, although formed of a mixture of a black pigment and a liquid crystal polymer, have a high black pigment concentration and exhibit some electrical conductivity, thus possibly impairing the dielectric properties of a liquid-crystal polymer film and causing a short circuit in a thin liquid-crystal polymer film. In the present invention, not only black pigment secondary particles but also high-concentration spots are decreased.

The number of high-concentration spots of a black pigment can be determined by the following method. First, a liquid-crystal polymer film is cut into a 10 cm×10 cm test specimen, and the test specimen is brought into close contact with a glass stage of a digital microscope ("VHX-5000" manufactured by Keyence Corporation). A 342-mm$^2$ region on the surface of the film is observed at a lens magnification of 200, at the maximum amount of transmitted light, and at a gain of 6.0 dB. The light source is only a transmission light source that emits light from a lower portion of the stage. The shutter speed depends on the film thickness, is gradually increased, and is adjusted between 10 to 1,000 ms such that a spot can sufficiently shield light even without lightness and gradation of the entire film and a spot of 10 µm or less can be clearly observed. Next, a cross section of the film is processed by ion milling or with a microtome equipped with a diamond knife. A cross section of a portion that appears black in the observation of the film surface is observed with a "laser microscope OLS-3000" manufactured by Olympus Corporation at a magnification in the range of 50 to 100. Binarization is performed by image analysis software using the central value of the lightness distribution as a threshold. The term "a high-concentration spot of a black pigment", as used herein, refers to a portion in which a black area constitutes 60% or more and less than 90% of the total area. Black pigment aggregates are composed almost entirely of a black pigment, and therefore the black area constitutes 90% or more. In a portion in which a black pigment is sufficiently dispersed in a liquid crystal polymer, the black area constitutes less than 60%. The size of each identified high-concentration spot of a black pigment is measured. The number of high-concentration spots with a size in the range of $3/10$ to $9/10$ of the film thickness or of the shortest distance between circuits disposed on both faces of the film and the number of high-concentration spots with a size of more than $9/10$ of the film thickness are counted. The size of each high-concentration spot is the maximum diameter in the film thickness direction. When the maximum and minimum diameters of each high-concentration spot are measured, spots with a maximum-to-minimum ratio of 10 or more are very likely to be fibrous foreign materials and are excluded.

High-concentration spots in a top view of a multilayer board can be detected in the same manner as the liquid-crystal polymer film by grinding the multilayer board from a surface opposite a surface layer portion with a grinder to leave only the surface layer portion with a thickness of 50 µm. In this case, the size of each high-concentration spot is the maximum diameter parallel to the shortest distance between two circuits disposed on both faces of the black liquid-crystal polymer film and can be determined by observing the surface of the multilayer board by the above method using a digital microscope. For high-concentration spots in a side view of a multilayer board, the method of observing a cross section of a liquid-crystal polymer film can be used. More specifically, a cross section of a multilayer board is processed by ion milling or with a microtome equipped with a diamond knife. A cross section of a liquid-crystal polymer film portion is observed with a laser microscope at a magnification in the range of 50 to 100. Binarization is performed by image analysis software using the central value of the lightness distribution as a threshold. When a white area, which is a liquid crystal polymer matrix portion, is distinguished from a black area, which is a black pigment aggregate, a portion in which the black area constitutes 60% or more and less than 90% of the total area is considered to be a high-concentration spot. The number of high-concentration spots and the maximum diameter of each high-concentration spot in the thickness direction of the black liquid-crystal polymer film are determined.

Although high-concentration spots of a black pigment contain a liquid crystal polymer and have lower electrical conductivity than black pigment aggregates, the high-concentration spots have some electrical conductivity and may cause a short circuit. Thus, high-concentration spots of a black pigment preferably have a smaller size. More specifically, when a film surface is observed on an enlarged scale, high-concentration spots of a black pigment preferably have a size of $9/10$ or less, more preferably $2/3$ or less, of the film thickness. The number density of high-concentration spots of a black pigment with a size in the range of $3/10$ to $9/10$ of the film thickness is preferably 15/342 mm$^2$ or less, more preferably 10/342 mm$^2$ or less. As described above, high-concentration spots with a maximum-to-minimum diameter ratio of 10 or more identified by the observation of a film on an enlarged scale are very likely to be fibrous foreign materials and are judged not to be high-concentration spots.

The term "long film", as used herein, refers to 5 m or more. Since the productivity increases with the length of a film to be produced, the length is preferably 10 m or more, more preferably 25 m or more, still more preferably 50 m or more. Although there is no particular upper limit, an excessively long film results in a heavy roll when wound into a roll and can be difficult to treat. Thus, the length is preferably 2,000 m or less, more preferably 1,000 m or less.

Since the productivity increases with the width of a film to be produced, the width is preferably 100 mm or more, more preferably 250 mm or more. With a film less than 100 mm in width, it can be difficult to manufacture an electronic circuit board. Although there is no particular upper limit, 1100 mm or less is preferred, and 500 mm or less is more preferred.

A black liquid-crystal polymer film according to the present invention can be produced by a melt extrusion method. More specifically, a black liquid-crystal polymer film according to the present invention can be produced by a method including a step of melt-kneading at least a liquid crystal polymer and a black pigment, a step of passing the molten mixture of the liquid crystal polymer and the black pigment through a filter with a pore size that is 80% or less of the thickness of the black liquid-crystal polymer film and is 40 µm or less, and a subsequent step of forming a film by a T-die method or an inflation method. Black pigment aggregates are often formed in liquid crystal polymers, and the present inventors have found that high-concentration spots of a black pigment are formed in liquid crystal polymers, but the above production method can reduce the formation of not only black pigment aggregates but also high-concentration spots of a black pigment in a black liquid-crystal polymer film.

Melt-kneading of a liquid crystal polymer and a black pigment can be performed by supplying a melt extruder with at least the liquid crystal polymer and the black pigment. For example, at least a liquid crystal polymer and a black pigment are supplied to a twin-screw extruder schematically illustrated in FIG. 1 and are sufficiently kneaded at a temperature equal to or higher than the melting point of the liquid crystal polymer to prepare pellets containing at least the liquid crystal polymer and the black pigment.

Figure 2:
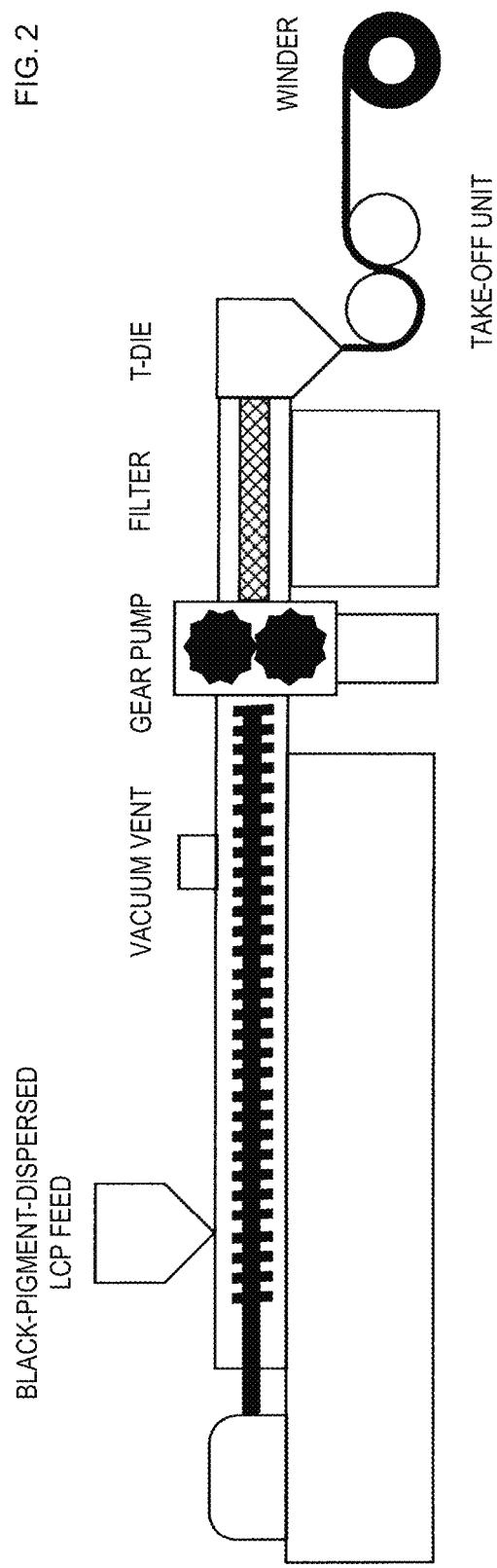
FIG. 2 is a schematic view of an embodiment of the production of a black liquid-crystal polymer film according to the present invention using a twin-screw extruder equipped with a filter and a die.

The molten mixture of the liquid crystal polymer and the black pigment is then passed through a filter with a pore size that is 80% or less of the thickness of the desired black liquid-crystal polymer film and is 40 µm or less. For example, as schematically illustrated in FIG. 2, a filter with a particular pore size and a die are attached to a twin-screw extruder, pellets containing the liquid crystal polymer and the black pigment are supplied to the twin-screw extruder, and the molten liquid crystal polymer containing the black pigment dispersed therein is extruded through the filter to form a film. In the present invention, a molten liquid crystal polymer containing a black pigment is directly formed into a film by the T-die method or the inflation method. In a film formed by the T-die method from a liquid crystal polymer, rigid liquid crystal polymer molecules are aligned in MD, and the film has anisotropy. In such a case, for example, as described in the invention of Japanese Unexamined Patent Application Publication No. 9-131789, an anisotropic liquid-crystal polymer film is subjected to an isotropic orientation treatment. More specifically, an anisotropic liquid-crystal polymer film is placed between two support films, such as porous polytetrafluoroethylene (PTFE) resin films, to form a multilayer body, is subjected to uniaxial stretching in TD or biaxial stretching in both MD and TD but preferentially in TD at a temperature equal to or higher than the melting point of the liquid crystal polymer to reduce anisotropy, is then cooled, and is separated from the support films.

In the production of a black liquid-crystal polymer film, simple melt-kneading of a liquid crystal polymer and a black pigment forms black pigment aggregates and high-concentration spots. Thus, in the present invention, the molten mixture is passed through a filter with a particular pore size to effectively disperse black pigment particles in a molten liquid crystal polymer, thereby decreasing the number of high-concentration spots and achieving a dielectric loss tangent of 0.0035 or less. A filter with a pore size that is 80% or less of the thickness of the desired black liquid-crystal polymer film and is 40 µm or less can sufficiently prevent the formation of high-concentration spots of a black pigment, and the liquid-crystal polymer film containing the black pigment can have a minimum dielectric breakdown strength of 60 kV/mm or more. The percentage with respect to the filter pore size is preferably 70% or less, more preferably 60% or less. The filter pore size is preferably 20 µm or less, more preferably 15 µm or less. The filter pore size is also preferably 5 µm or more, more preferably 10 µm or more. A filter pore size of less than 5 µm results in frequent clogging of the filter and possibly low productivity.

The filter pore size is preferably such that the nominal filtration rating or collection efficiency of the filter is 98%. The filter may be of any type and shape, provided that the filter can be attached to the melt extruder, for example, a leaf disk filter, a pleated filter, or a candle filter. The filter may be made of any material and is preferably made of a sintered metal-fiber nonwoven fabric material in terms of mechanical strength and heat resistance.

A black liquid-crystal polymer film according to the present invention can be formed into a laminated sheet by stacking a metal foil on one or both faces of the film. The metal foil constituting the laminated sheet may be made of any electrically conductive material. Examples of the metal foil include copper, aluminum, nickel, tin, and alloys thereof. Copper foil is preferred in terms of electrical conductivity, chemical stability, and cost. The copper foil may be rolled copper foil or electrolytic copper foil. The surface of the copper foil is preferably subjected to rust-proofing with Zn, Ni, Co, Cr, or the like. For a wire bonding method or a flip-chip bonding method, a mounting pattern of a circuit formed by etching copper foil may be plated with Ni/Au. The thickness of the metal foil is appropriately adjusted and, for example, ranges from approximately 2 to 70 µm, preferably approximately 5 to 35 µm.

The metal foil preferably has a small surface roughness to impart good high-frequency characteristics to an electronic circuit board according to the present invention. Thus, one face (M face) of the metal foil in contact with the liquid-crystal polymer film preferably has a surface roughness Rz of 3 µm or less, and the other face (S face) preferably has a surface roughness Rz of 2 µm or less. The surface roughness Rz has no particular lower limit and is preferably 0.2 µm or more, more preferably 0.4 µm or more, in terms of adhesiveness to the liquid-crystal polymer film. The surface roughness of the metal foil can be measured according to JIS B 0601 using a stylus with a tip radius of curvature of 2 µm and a stylus profilometer.

Because the liquid crystal polymer is thermoplastic, a laminated sheet according to the present invention can be easily produced by placing a metal foil on one or both faces of the black liquid-crystal polymer film and hot-pressing the black liquid-crystal polymer film. The hot press may be performed by a known method using a vacuum press machine, a roll press machine, or a double-belt press machine. The conditions for hot press are appropriately adjusted. For example, for a vacuum press machine, the temperature ranges from approximately 100° C. to 350° C., and the pressure ranges from approximately 1 to 10 MPa for approximately 1 minute to 2 hours.

In a laminated sheet according to the present invention, in particular, high adhesion between the metal foil and the liquid-crystal polymer film is preferred. More specifically, the peel strength is preferably 0.7 N/mm or more according to JIS C 6471, in which a metal foil is etched to form a 5-mm metal foil pattern, and the metal foil pattern is peeled with a tensile tester at a speed of 50 mm/min and at an angle of 180 degrees to determine the peel strength (unit: N/mm).

The metal foil of the laminated sheet is partly chemically etched by routine procedures to form a desired circuit pattern, thus producing an electronic circuit board. As a matter of course, an electronic circuit component can be mounted on the circuit pattern. The electronic circuit component may be any component that can be mounted on the electronic circuit board, for example, a chip resistor, a chip capacitor, or a semiconductor package, as well as a semiconductor device.

A first multilayer board according to the present invention includes two or more electronic circuit boards, wherein the electronic circuit boards have a metal foil on one or both faces of a black liquid-crystal polymer film with a circuit being formed on the metal foil, the black liquid-crystal polymer film contains a black pigment and a liquid crystal polymer, and the black liquid-crystal polymer film has a lightness of 45 or less, the black liquid-crystal polymer film has a dielectric loss tangent of 0.0035 or less, and the black liquid-crystal polymer film has a minimum dielectric breakdown strength of 60 kV/mm or more. A second multilayer board according to the present invention includes two or more electronic circuit boards wherein the electronic circuit boards have a metal foil on one or both faces of a black liquid-crystal polymer film with a circuit being formed on the metal foil, the black liquid-crystal polymer film contains a black pigment and a liquid crystal polymer, and in a side view, in the black liquid-crystal polymer film, a number density of high-concentration spots of the black pigment with a size in the range of 3/10 to 9/10 of the shortest distance between the circuits disposed on both faces of the black liquid-crystal polymer film is 15/342 mm$^2$ or less.

A multilayer board according to the present invention includes two or more layered electronic circuit boards, and the electronic circuit boards have a metal foil on one or both faces of a black liquid-crystal polymer film with a circuit being formed on the metal foil. The embodiments, explanations, and definitions of a black liquid-crystal polymer film, a laminated sheet, and an electronic circuit board according to the present invention are applicable to a black liquid-crystal polymer film and an electronic circuit board contained in a multilayer board according to the present invention. Because a multilayer board according to the present invention can be produced by only stacking two or more electronic circuit boards according to the present invention, a multilayer board according to the present invention substantially retains the good characteristics of a black liquid-crystal polymer film, a laminated sheet, and an electronic circuit board according to the present invention. More specifically, because electronic circuit boards according to the present invention can be bonded together by hot press at a temperature lower than the melting point of the liquid crystal polymer, the orientation of the black liquid-crystal polymer film is not significantly changed, and the black liquid-crystal polymer film substantially retains their characteristics, such as lightness, dielectric properties, and insulating properties after the hot press bonding. For example, the rate of change in dielectric loss tangent by hot press bonding is 5% or less at 60 GHz. Furthermore, when a circuit pattern itself is confidential, an insulating layer of a multilayer board according to the present invention, which is a black liquid-crystal polymer film, can hide the inner circuit pattern from the outside, thus making it difficult to analyze the circuit pattern. The maximum-to-minimum ratio of in-plane thermal linear expansion coefficient of a black liquid-crystal polymer film constituting a multilayer board according to the present invention preferably ranges from 1.0 to 2.5 in terms of strength.

A multilayer board according to the present invention can be produced by routine procedures except that a black liquid-crystal polymer film according to the present invention is used as an insulating layer. More specifically, a metal foil of a laminated sheet of a size depending on the size of a desired multilayer board is etched to form a circuit on one or both faces of the black liquid-crystal polymer film and thereby produce an electronic circuit board constituting each layer of the desired multilayer board. In this step, each electronic circuit board is preferably subjected to AOI to check the circuit pattern shape. Because an electronic circuit board according to the present invention has a large difference in optical reflectance between the circuit portion and the liquid-crystal polymer film portion, as described above, accurate inspection can be performed by AOI.

If necessary, a through-hole for connecting circuits on different layers is formed by laser or the like, and a conductive paste is poured into the through-hole. The conductive paste is, but not limited to, a conductive paste containing Sn, such as a Cu—Sn paste, for example. The formation of a circuit, the formation of a through-hole, and filling of the through-hole with a conductive paste may be performed in any order. A through-hole may be formed in a laminated sheet and then filled with a conductive paste before a circuit is formed. Alternatively, a circuit may be formed before a through-hole is formed and filled with a conductive paste. An electronic device may be mounted on a circuit of each electronic circuit board. The electronic device is, but not limited to, a semiconductor device, a chip resistor, a chip capacitor, or a semiconductor package (PKG), for example.

Two or more electronic circuit boards are then stacked and hot-pressed to form a multilayer board. Because the liquid crystal polymer is thermoplastic, the black liquid-crystal polymer films or the black liquid-crystal polymer film and a circuit face can be directly bonded by hot press. Hot press in this case can be performed under the same conditions as hot press bonding between the black liquid-crystal polymer film and a metal foil to form a laminated sheet. More specifically, hot press can be performed by a known method using a vacuum press machine, a roll press machine, or a double-belt press machine. The conditions for hot press are appropriately adjusted. For example, for a vacuum press machine, the temperature ranges from approximately 100° C. to 350° C., and the pressure ranges from approximately 1 to 10 MPa for approximately 1 minute to 2 hours. The hot press temperature is also preferably lower than the melting point of the liquid crystal polymer. When the hot press temperature is lower than the melting point of the liquid crystal polymer, the characteristics of the black liquid-crystal polymer film before hot press bonding is reliably maintained by the black liquid-crystal polymer film constituting the multilayer board. When the hot press temperature is lower than the melting point, to increase the adhesive strength between the black liquid-crystal polymer films or between the black liquid-crystal polymer film and a circuit face, the surface of the black liquid-crystal polymer film can be modified by a known method to improve adhesiveness. A multilayer board according to the present invention can be mounted on a mother board to produce an electronic component.

Figure 6:
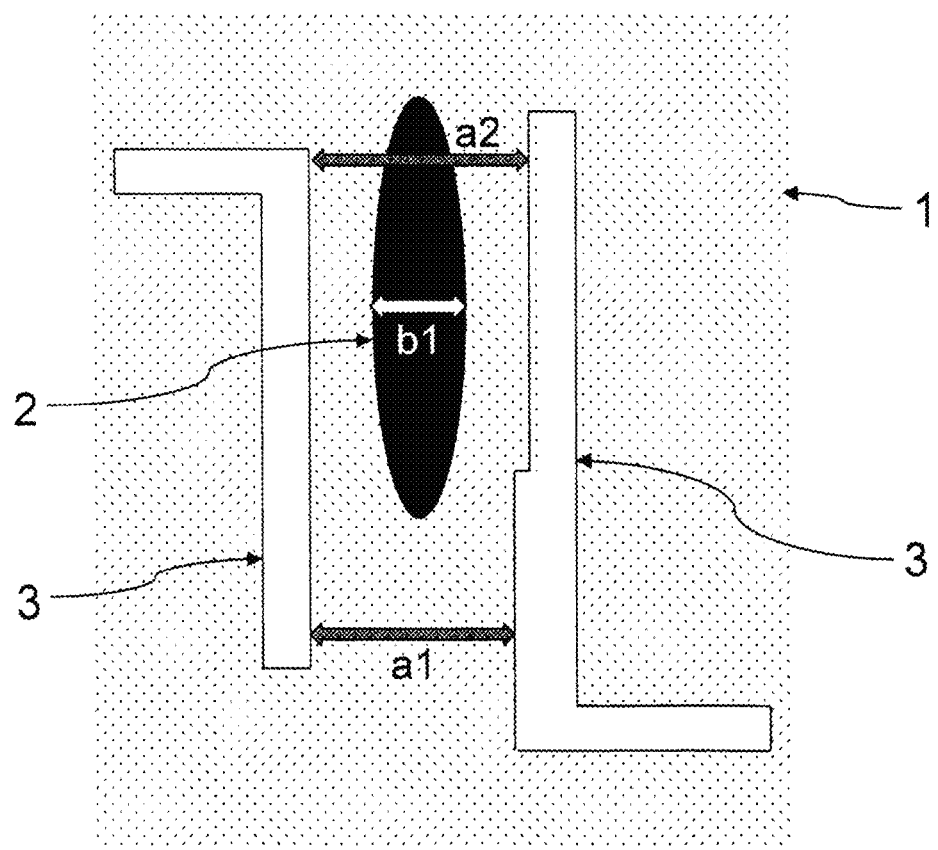
FIG. 6 is a schematic top view of a multilayer board according to the present invention.

The black liquid-crystal polymer film constituting a multilayer board according to the present invention substantially retains the good characteristics of a black liquid-crystal polymer film according to the present invention alone. For example, the black liquid-crystal polymer film constituting a multilayer board according to the present invention has not only a decreased number of black pigment aggregates but also a decreased number of spots containing a high concentration of a black pigment in addition to a liquid crystal polymer. For example, as illustrated in FIG. 6, in a black liquid-crystal polymer film constituting a multilayer board according to the present invention, in a top view of the multilayer board, the size of a high-concentration spot of a black pigment disposed between two circuits formed on one face of the black liquid-crystal polymer film, more specifically, the maximum diameter $b_1$ parallel to the shortest distance $a_1$ between the two circuits, is preferably 9/10 or less of the shortest distance $a_1$ between the circuits. Controlling the size of a high-concentration spot within this range can effectively prevent a short circuit between circuits on one face of the black liquid-crystal polymer film. In a multilayer board, a circuit on one black liquid-crystal polymer film may have different widths. In such a case, for example, in FIG. 6, the shortest distance between two circuits is not $a_2$ but is $a_1$. In the case that one high-concentration spot is disposed in a region including facing circuits and in a region including only one circuit, as illustrated in FIG. 6, the size of the high-concentration spot is the maximum diameter in the region including facing circuits.

Figure 7:
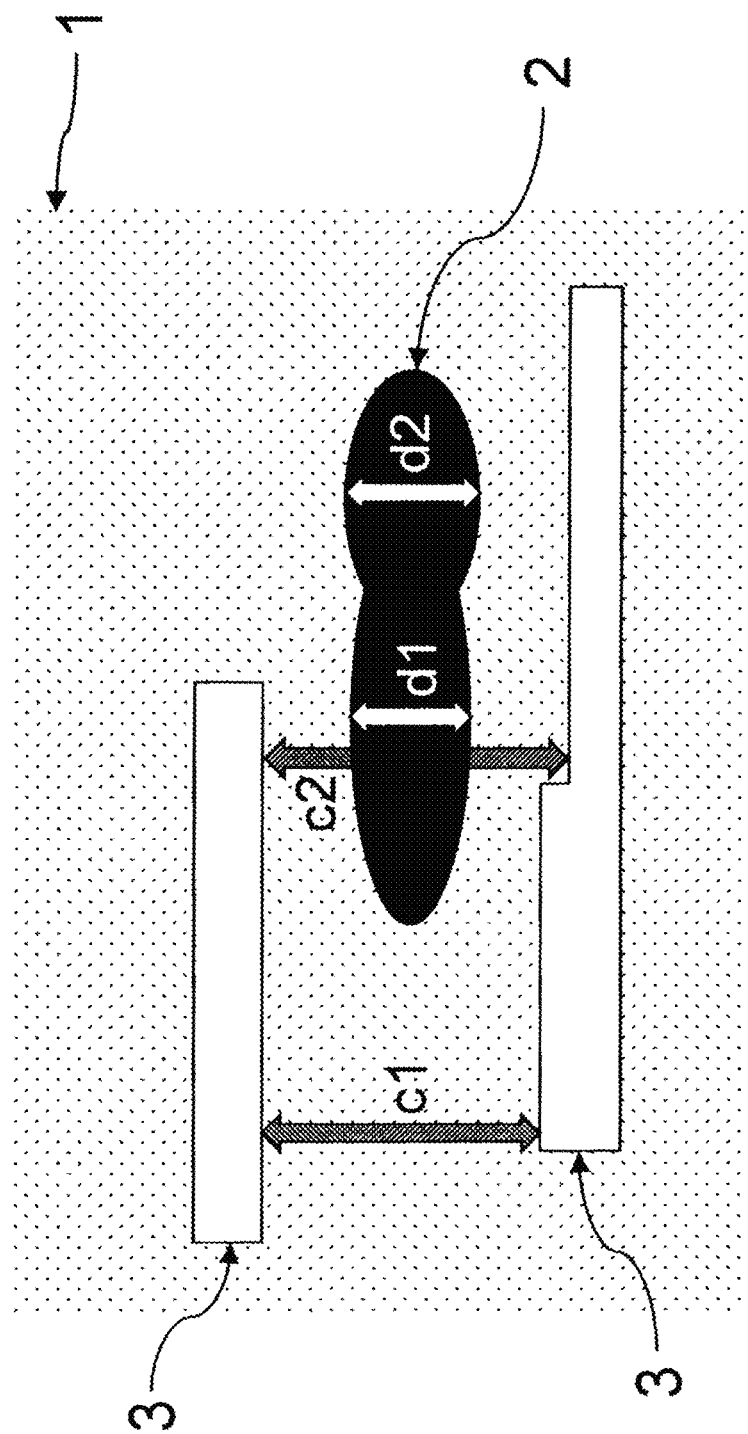
FIG. 7 is a schematic side view of a multilayer board according to the present invention.

As illustrated in FIG. 7, in a black liquid-crystal polymer film constituting a multilayer board according to the present invention, in a side view of the multilayer board, the size of a high-concentration spot of a black pigment between two circuits disposed on both faces of the black liquid-crystal polymer film, more specifically, the maximum diameter $d_1$ parallel to the shortest distance $c_1$ between the two circuits, is preferably 9/10 or less of the shortest distance $c_1$ between the circuits. Controlling the size of a high-concentration spot within this range can effectively prevent a short circuit between circuits in the thickness direction of the multilayer board. In a multilayer board, a circuit may have different widths. In such a case, for example, in FIG. 7, the shortest distance between two circuits is not c2 but is c1. In the case that one high-concentration spot is disposed in a region including facing circuits and in a region including only one circuit, as illustrated in FIG. 7, the size of the high-concentration spot is not the maximum diameter d2 in the region including only one circuit but is the maximum diameter d1 in the region including facing circuits.

Furthermore, as illustrated in FIGS. 8(1) and 8(2), in a black liquid-crystal polymer film constituting a multilayer board according to the present invention, in a side view of the multilayer board, the size of a high-concentration spot of a black pigment disposed directly above and/or directly under a circuit disposed in contact with the black liquid-crystal polymer film, more specifically, the maximum diameter in the in-plane direction of the film, is preferably ½ or less of the minimum width of the circuit. A high-concentration spot of the black pigment is a mixture of a liquid crystal polymer and a black pigment and has low adhesiveness to a metal of a circuit due to its gel-like structure. Thus, when the ratio is more than ½, a circuit may be separated from the black liquid-crystal polymer film. In the case that a high-concentration spot of a black pigment is disposed directly above and/or directly under a circuit and directly above and/or directly under a space between circuits, the size of the high-concentration spot refers to the maximum diameter in the in-plane direction in a region directly above and/or directly under the circuit.

The present application claims the priority of Japanese Patent Application No. 2016-236266 filed Dec. 5, 2016. The specification of Japanese Patent Application No. 2016-236266 filed Dec. 5, 2016 is incorporated herein by reference in its entirety.

EXAMPLES

Although the present invention is more specifically described in the following examples, the present invention is not limited to these examples. As a matter of course, various modifications may be made to these examples without departing from the gist described above and below. These modifications are also within the technical scope of the present invention.

First, the test conditions for a liquid-crystal polymer film and a copper-clad laminate produced are described.

Test Example 1

Measurement of Lightness

A liquid-crystal polymer film was cut into a 10 cm×10 cm test specimen. The test specimens stacked to a total thickness of 100 μm or more were placed in close contact with a cavity of a spectrophotometer ("CM-600d" manufactured by Konica Minolta, Inc.) such that the film surface to be measured was irradiated with measuring light. CIE1976 lightness $L^*$ was measured by the reflection method according to JIS Z 8722 using an integrating sphere (8°: di) as an optical system, with a cloudy light source, and at a visual field of 2°. The film surface was irradiated with measuring light, and reflected light was collected by the integrating sphere. The amount of light was measured with a photoreceptor. Measurements of 10 test specimens prepared from the same liquid-crystal polymer film were averaged.

Test Example 2

Measurement of Relative Permittivity and Dielectric Loss Tangent

A liquid-crystal polymer film was cut into a 10 cm×10 cm test specimen. The test specimen was dried in a circulating oven at 50° C. for 24 hours and was cooled to room temperature in the reference atmosphere according to JIS C 6481. First, the resonant frequency of a resonator alone without the test specimen and the Q-value of the peak were measured with a network analyzer ("ENA E5071C" manufactured by Agilent Technologies) and a split post dielectric resonator manufactured by QWED with a measurement frequency of 3.18 GHz. The test specimens stacked to a total thickness of 100 μm or more were then placed in the resonator, and the resonant frequency and Q-value were measured in the presence of the test specimens. The relative permittivity was calculated from the difference in resonant frequency between the resonator alone and the resonator including the test specimens. The dielectric loss tangent was calculated from the difference in Q-value and the difference in resonant frequency between the resonator alone and the resonator including the test specimens. Measurements of 10 test specimens prepared from the same liquid-crystal polymer film were averaged.

Test Example 3

Measurement of Dielectric Breakdown Strength

A liquid-crystal polymer film was cut into a 10 cm×10 cm test specimen. The test specimen was dried in a circulating oven at 50° C. for 24 hours and was cooled to room temperature in the reference atmosphere according to JIS C 6481 before measurement. The test specimen was placed between a lower electrode 75 mm in diameter and an upper electrode 25 mm in diameter in a withstand voltage tester ("TW-5110 ADMPS" manufactured by Tamadensoku Co., Ltd.). An alternating voltage was applied to the test specimen in the thickness direction of the test specimen and was gradually increased to 8 kV. The breakdown voltage was measured when an electric current of 5 mA flowed between the upper and lower electrodes, and was divided by the thickness of the test specimen to calculate the dielectric breakdown strength. The dielectric breakdown strength was measured in 100 test specimens cut from the same liquid-crystal polymer film at intervals of 10 cm, and the average value and the minimum value were determined. When an electric current of 5 mA did not flow between the upper and lower electrodes even at a voltage of 8 kV, the dielectric breakdown strength was the voltage of 8 kV or more divided by the thickness of the test specimen.

Test Example 4

Measurement of Thermal Linear Expansion Coefficient

The thermal linear expansion coefficient was measured with a thermomechanical analyzer ("Q400" manufactured by TA Instruments) in tensile mode according to JIS C 6481. More specifically, a liquid-crystal polymer film was cut into a 4 mm×20 mm test specimen. The test specimen was placed in the analyzer at a distance of 15 mm between the grips. The test specimen was heated from normal temperature to 170° C. at a heating rate of 40° C./min at a load of 0.1 N, was held at 170° C. for 1 minute, and was cooled from 170° C. to normal temperature at a cooling rate of 10° C./min. The change ΔL in the distance between the grips was measured while the temperature was decreased from 100° C. to 50° C. The thermal linear expansion coefficient was calculated using the following formula.

Thermal linear expansion coefficient (ppm/° C.)=ΔL/ (L×ΔT)

[wherein ΔL denotes the change in distance between the grips (mm), L denotes the distance between the grips (15 mm), and ΔT denotes the temperature difference (50° C.)]

The maximum-to-minimum ratio of thermal linear expansion coefficient was calculated from the minimum value and the maximum value of six thermal linear expansion coefficients measured at intervals of 30 degrees in the circumferential direction on the surface of the film.

Test Example 5

Number of High-Concentration Spots of Black Pigment

A liquid-crystal polymer film was cut into a 10 cm×10 cm test specimen, and the test specimen was brought into close contact with a glass stage of a digital microscope ("VHX-5000" manufactured by Keyence Corporation). A 342-mm$^2$ region on the surface of the film was observed at a lens magnification of 200, at the maximum amount of transmitted light, and at a gain of 6.0 dB. The light source was only a transmission light source that emitted light from a lower portion of the stage. The shutter speed depended on the film thickness, was gradually increased, and was adjusted between 10 to 1,000 ms such that a spot could sufficiently shield light even without lightness and gradation of the entire film and a spot of 10 μm or less could be clearly observed.

Figure 3:
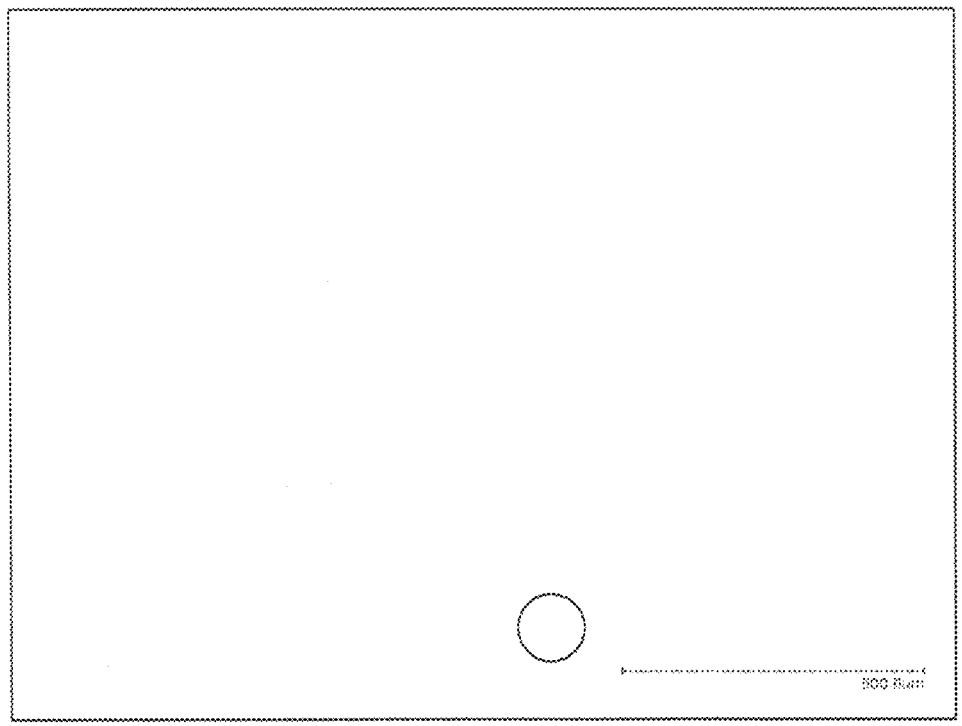
FIG. 3 is an enlarged photograph of a film produced in Example 1 described later.
Figure 4:
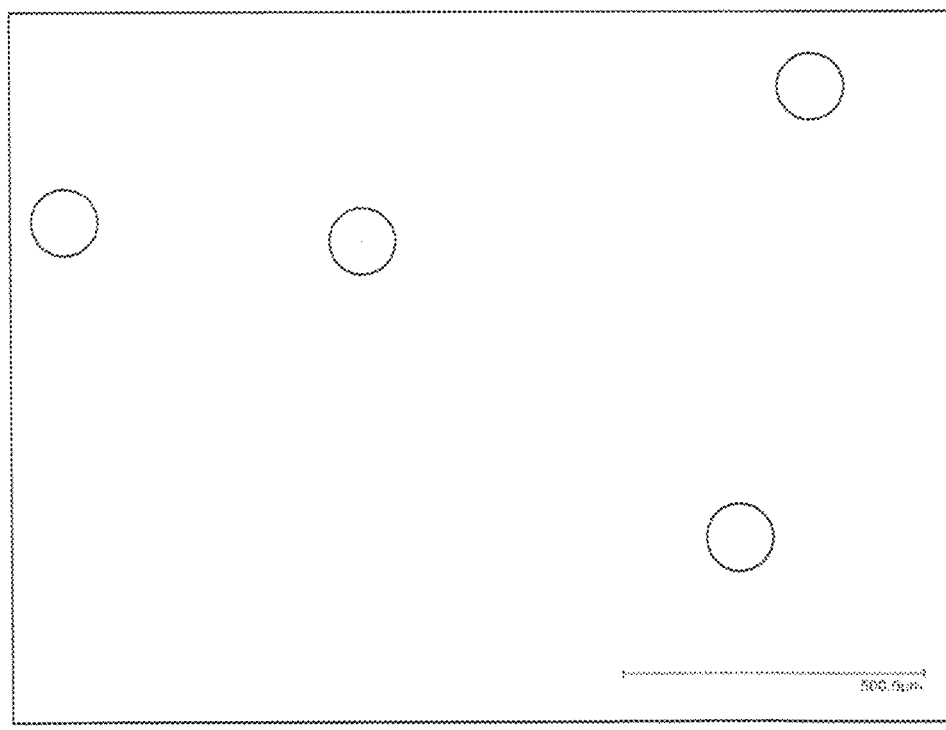
FIG. 4 is an enlarged photograph of a film produced in Comparative Example 5 described later.
Figure 5:
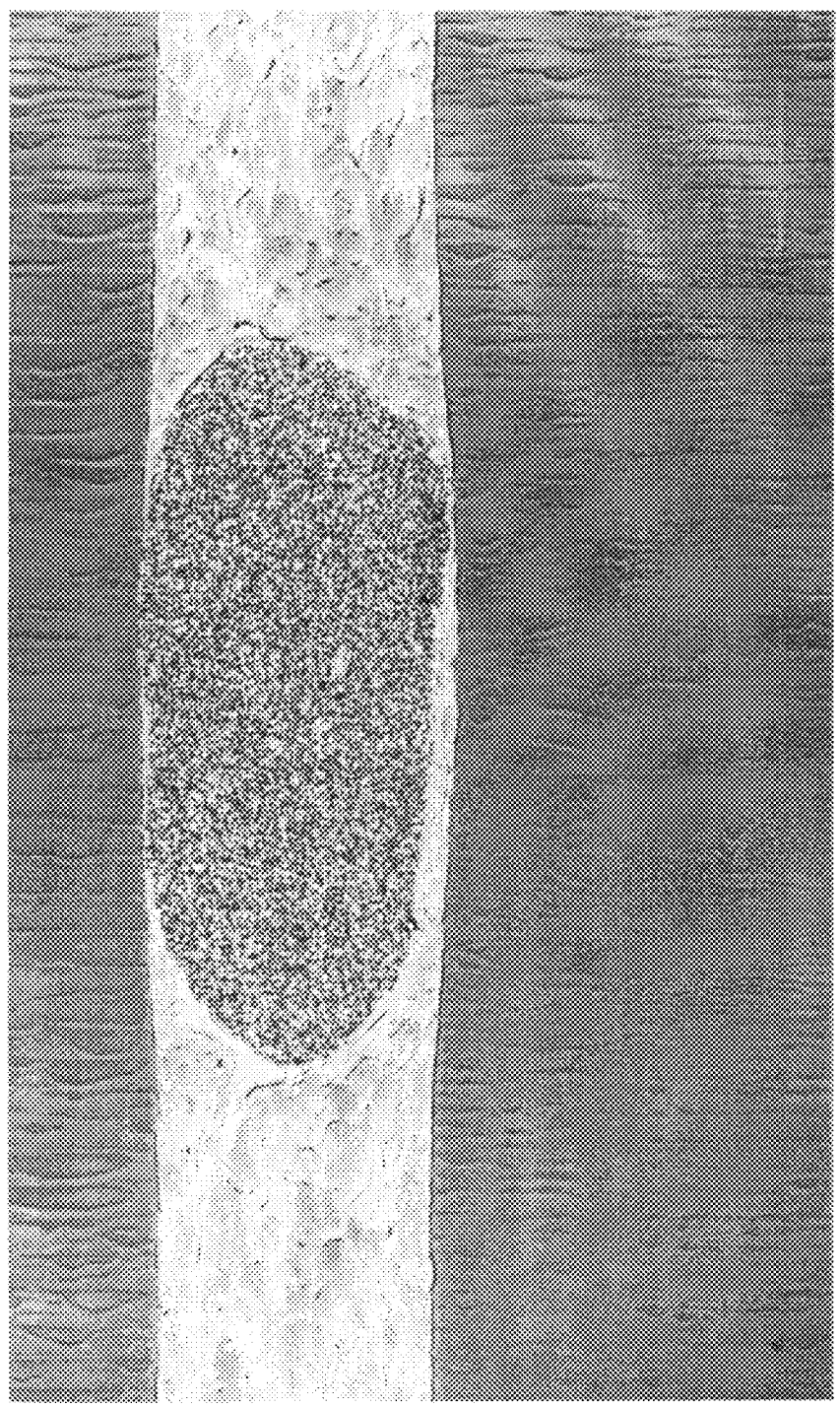
FIG. 5 is an enlarged cross-sectional photograph of a high-concentration spot of a black pigment observed in a film produced in Comparative Example 5 described later.

Next, with respect to a black lump observed, a 1 mm×5 mm test specimen containing the black lump was cut out and was embedded in an epoxy resin. An observation surface through which a cross section of the black lump was exposed was then formed using an ultramicrotome ("UCT" manufactured by Leica) with a diamond knife. The exposed cross section of the black lump was observed with a laser microscope ("OLS-3000" manufactured by Olympus Corporation) at a magnification in the range of 50 to 100 using a laser beam with a wave length of 408 nm as a light source. The observed image was subjected to binarization by image analysis software using the central value of the lightness distribution as a threshold. When a white area, which was a liquid crystal polymer matrix portion, was distinguished from a black area, which was a black pigment portion, the black pigment fraction ranged from 75% to 85% in all observed black lumps. This proved that all the black lumps observed in the transmitted light observation were high-concentration spots. Next, the maximum diameter of each high-concentration spot in the film thickness direction was measured, and the number of high-concentration spots with a maximum diameter in the range of 3/10 to 9/10 of the film thickness and the number of high-concentration spots with a size of more than 9/10 of the film thickness were counted. Those with a maximum-to-minimum diameter ratio of 10 or more were very likely to be fibrous foreign materials and were excluded. FIGS. 3 and 4 are enlarged photographs of the films according to Example 1 and Comparative Example 5, respectively. FIG. 5 is an enlarged photograph of a black pigment high-concentration spot with a size of more than 9/10 of the film thickness in the black liquid-crystal polymer film according to Comparative Example 5.

Test Example 6

Measurement of Peel Strength

A copper foil was peeled with a tensile tester ("AGS-H" manufactured by Shimadzu Corporation) according to JIS C 6471 at a speed of 50 mm/min and at an angle of 180 degrees to determine the peel strength (unit: N/mm). More specifically, a laminated sheet was cut into a 3 cm×10 cm test specimen. A 5 mm in width×10 cm masking tape was put on the center of the test specimen on the copper foil side in the longitudinal direction. The test specimen was immersed in an iron (III) chloride solution to remove an unnecessary portion of the copper foil by etching. Subsequently, the laminated sheet was washed with water to remove the masking tape and was dried in a circulating oven at 80° C. for 1 hour to prepare a test specimen with a linear circuit pattern 5 mm in width. The test specimen was bonded for reinforcement to a Bakelite plate 2 mm in thickness with a two-sided adhesive tape ("No. 5015" manufactured by Nitto Denko Corporation) so that the peel angle could not be changed by bending of the test specimen when the copper foil was peeled from the test specimen. One end of the circuit pattern formed on the test specimen was peeled and was pinched in the tensile tester. The copper foil was peeled by 10 mm or more at an angle of 180 degrees to the test specimen and at a speed of 50 mm/min. The strength during the peeling was averaged to determine the peel strength. Measurements of three test specimens prepared from the same liquid-crystal polymer film were averaged.

Test Example 7

Measurement of Thickness

The thickness of the center of each 10 cm×10 cm test specimen prepared for the measurement of the relative permittivity, dielectric loss tangent, and dielectric breakdown strength was measured with a digital thickness gauge ("SMD-565" manufactured by Teclock, probe tip diameter: 2 mm). More specifically, five thicknesses of the center of the test specimen and four vertexes of a 4 cm×4 cm square the center of which was the center of the test specimen were measured and were averaged to determine the thickness of the test specimen.

Example 1

Preparation of Black Liquid-Crystal Polymer Single-Sided Copper-Clad Laminate According to Present Invention (1) Preparation of Black Liquid-Crystal Polymer Film A liquid crystal polymer ("C950" manufactured by Polyplastics Co., Ltd.) and carbon black (particle size: 75 nm, specific surface area: 30 m$^2$/g) were supplied to a twin-screw extruder with a vacuum vent and were melt-kneaded at 340° C. to produce black liquid-crystal polymer pellets containing carbon black dispersed therein. The proportion of the carbon black was 0.5% by weight. The pellets were then supplied to a twin-screw extruder equipped with a vacuum vent and were melt-extruded at 340° C. through a gear pump, a filter (pore size: 10 μm), and a T-die to form a black liquid-crystal polymer uniaxially orientated film 42 μm in thickness. An expanded porous PTFE resin film (thickness: 30 μm, mass per unit area: 30 g/m²) was then bonded to both faces of the black liquid-crystal polymer uniaxially orientated film at 270° C. to form a laminate (peel strength: 5 g/cm). The black liquid-crystal polymer uniaxially orientated film was then stretched in TD at a stretching temperature of 345° C., at a stretch ratio of 3.2, and at a stretching rate of 20%/s and was removed from the expanded porous PTFE resin films to prepare an isotropically oriented black liquid-crystal polymer film 13 μm in thickness.

(2) Preparation of Black Liquid-Crystal Polymer Two-Layer Single-Sided Copper-Clad Laminate A copper foil ("SEED-B-12 μm" manufactured by Nippon Denkai, Ltd.) was placed on one face of the black liquid-crystal polymer film prepared in (1) such that the M face of the copper foil was in contact with the black liquid-crystal polymer film. A polyimide film ("UPILEX 20S" manufactured by Ube Industries, Ltd.) was placed on the other face of the black liquid-crystal polymer film as a mold release material. The laminate was then placed between two stainless steel plates 2 mm in thickness. A stainless steel fiber woven fabric 1 mm in thickness was then placed on the stainless steel plates as cushioning materials. The laminate was then held in a vacuum press machine at 300° C. and at a pressure of 3 MPa for 5 minutes to prepare a black liquid-crystal polymer single-sided copper-clad laminate with a "copper foil/black liquid-crystal polymer film" structure.

Example 2

An isotropically oriented black liquid-crystal polymer film 18 μm in thickness and a black liquid-crystal polymer single-sided copper-clad laminate were prepared in the same manner as in Example 1 except that the uniaxially orientated film had a thickness of 58 μm.

Example 3

An isotropically oriented black liquid-crystal polymer film 25 μm in thickness and a black liquid-crystal polymer single-sided copper-clad laminate were prepared in the same manner as in Example 1 except that the filter pore size was 15 μm and the uniaxially orientated film had a thickness of 80 μm.

Example 4

An isotropically oriented black liquid-crystal polymer film 25 μm in thickness and a black liquid-crystal polymer single-sided copper-clad laminate were prepared in the same manner as in Example 1 except that the filter pore size was 20 μm and the uniaxially orientated film had a thickness of 80 μm.

Example 5

An isotropically oriented black liquid-crystal polymer film 50 μm in thickness and a black liquid-crystal polymer single-sided copper-clad laminate were prepared in the same manner as in Example 1 except that the filter pore size was 40 μm and the uniaxially orientated film had a thickness of 160 μm.

Comparative Example 1

An isotropically oriented black liquid-crystal polymer film 13 μm in thickness and a black liquid-crystal polymer single-sided copper-clad laminate were prepared in the same manner as in Example 1 except that the filter pore size was 15 μm.

Comparative Example 2

An isotropically oriented black liquid-crystal polymer film 18 μm in thickness was prepared in the same manner as in Example 2 except that the filter pore size was 15 μm, and a black liquid-crystal polymer single-sided copper-clad laminate was prepared in the same manner as in Example 1.

Comparative Example 3

An isotropically oriented black liquid-crystal polymer film 25 μm in thickness was prepared in the same manner as in Example 3 except that the filter pore size was 40 μm, and a black liquid-crystal polymer single-sided copper-clad laminate was prepared in the same manner as in Example 1.

Comparative Example 4

An isotropically oriented black liquid-crystal polymer film 50 μm in thickness was prepared in the same manner as in Example 5 except that the filter pore size was 60 μm, and a black liquid-crystal polymer single-sided copper-clad laminate was prepared in the same manner as in Example 1.

Comparative Example 5

An isotropically oriented black liquid-crystal polymer film 25 μm in thickness was prepared in the same manner as in Example 3 except that the filter was not used, and a black liquid-crystal polymer single-sided copper-clad laminate was prepared in the same manner as in Example 1.

Comparative Example 6

Only a liquid crystal polymer ("C950" manufactured by Polyplastics Co., Ltd.) was supplied to a twin-screw extruder equipped with a vacuum vent and was melt-extruded at 340° C. through a gear pump, a polymer filter (pore size: 15 μm), and a T-die to form a liquid-crystal polymer uniaxially orientated film 80 μm in thickness. An expanded porous PTFE resin film (thickness: 30 μm, mass per unit area: 30 g/m²) was then bonded to both faces of the liquid-crystal polymer uniaxially orientated film at 270° C. to form a laminate (peel strength: 5 g/cm). The liquid-crystal polymer uniaxially orientated film was then stretched at a stretching temperature of 345° C., at a stretch ratio of 3.2, and at a stretching rate of 20%/s and was removed from the expanded porous PTFE resin films to prepare an isotropically oriented uncolored liquid-crystal polymer film 25 μm in thickness. An uncolored liquid crystal polymer single-sided copper-clad laminate was prepared in the same manner as in Example 1.

Table 1 lists the characteristics of the black liquid-crystal polymer films and the black liquid-crystal polymer single-sided copper-clad laminates prepared in Examples 1 to 5 and Comparative Examples 1 to 5 and the uncolored liquid-crystal polymer film and the uncolored liquid crystal polymer single-sided copper-clad laminate prepared in Comparative Example 6.

TABLE 1

|  |  | Example 1 | Example 2 | Example 3 | Example 4 | Example 5 | Comparative example 1 |
|---|---|---|---|---|---|---|---|
| Carbon black (CB) concentration | | 0.5% | 0.5% | 0.5% | 0.5% | 0.5% | 0.5% |
| Filter pore size | | 10 μm | 10 μm | 15 μm | 20 μm | 40 μm | 15 μm |
| Film thickness | | 13 μm | 18 μm | 25 μm | 25 μm | 50 μm | 13 μm |
| Ratio of filter pore size to film thickness | | 77% | 56% | 60% | 80% | 80% | 115% |
| Number of CB spots (/342 mm$^2$) | With size of 3/10 to 9/10 of film thickness | 12 | 10 | 9 | 13 | 8 | 20 |
| | With size of 9/10 or more of film thickness | 0 | 0 | 0 | 0 | 0 | 2 |
| Number of CB aggregates | | 0 | 0 | 0 | 0 | 0 | 0 |
| Lightness (L*) | | 39 | 36 | 37 | 37 | 36 | 40 |
| Relative permittivity | | 3.38 | 3.46 | 3.54 | 3.53 | 3.46 | 3.41 |
| Dielectric loss tangent | | 0.0030 | 0.0028 | 0.0029 | 0.0028 | 0.0030 | 0.0027 |
| Dielectric breakdown strength (kV/mm) | Minimum | 102 | 156 | 101 | 125 | 151 | 26 |
| | Average | 153 | 205 | 186 | 199 | 155 | 72 |
| Peel strength (N/mm) | | 0.73 | 0.79 | 0.87 | 0.85 | 0.87 | 0.72 |
| Thermal linear expansion coefficient (ppm/° C.) | Maximum | 14 | 17 | 18 | 19 | 20 | 15 |
| | Minimum | 11 | 12 | 13 | 13 | 19 | 10 |
| | Maximum/minimum | 1.3 | 1.4 | 1.4 | 1.5 | 1.1 | 1.5 |

|  |  | Comparative example 2 | Comparative example 3 | Comparative example 4 | Comparative example 5 | Comparative example 6 |
|---|---|---|---|---|---|---|
| Carbon black (CB) concentration | | 0.5% | 0.5% | 0.5% | 0.5% | 0% |
| Filter pore size | | 15 μm | 40 μm | 60 μm | — | 15 μm |
| Film thickness | | 18 μm | 25 μm | 50 μm | 25 μm | 25 μm |
| Ratio of filter pore size to film thickness | | 83% | 160% | 120% | — | 60% |
| Number of CB spots (/342 mm$^2$) | With size of 3/10 to 9/10 of film thickness | 20 | 29 | 36 | 41 | 0 |
| | With size of 9/10 or more of film thickness | 0 | 2 | 11 | 9 | 0 |
| Number of CB aggregates | | 0 | 0 | 0 | 0 | 0 |
| Lightness (L*) | | 37 | 37 | 37 | 36 | 76 |
| Relative permittivity | | 3.39 | 3.51 | 3.48 | 3.69 | 3.40 |
| Dielectric loss tangent | | 0.0026 | 0.0030 | 0.0034 | 0.0039 | 0.0020 |
| Dielectric breakdown strength (kV/mm) | Minimum | 27 | 21 | 54 | 15 | 100 or more |
| | Average | 124 | 154 | 108 | 53 | 320 or more |
| Peel strength (N/mm) | | 0.77 | 0.82 | 0.88 | 0.82 | 0.85 |
| Thermal linear expansion coefficient (ppm/° C.) | Maximum | 17 | 18 | 20 | 19 | 19 |
| | Minimum | 12 | 14 | 19 | 14 | 15 |
| | Maximum/minimum | 1.4 | 1.3 | 1.1 | 1.4 | 1.3 |

The data in Table 1 show that a black liquid-crystal polymer film according to the present invention is a black insulating substrate with a lightness (L) in the range of 36 to 39 but has good dielectric properties: a relative permittivity of 3.5 or less and a dielectric loss tangent of 0.003 or less. A comparison of Comparative Example 5 in which the filter was not used and Examples 1 to 5 shows that Examples 1 to 5 decreased the dielectric loss tangent from 0.0039 to 0.0030 or less, which corresponds to an approximately 28% decrease in signal loss resulting from absorption by a dielectric material, while maintaining the same lightness. Comparative Example 4 in which the 60 μm filter was used and Comparative Example 5 in which the filter was not used had a larger number of high-concentration spots of carbon black than Examples 1 to 5 and Comparative Examples 1 to 3, which was responsible for increased dielectric loss tangents. The dielectric breakdown strength of each of the black liquid-crystal polymer films according to Comparative Examples 1 to 5 varies greatly with the measurement position and is very low at some measurement positions. By contrast, the black liquid-crystal polymer films according to Examples 1 to 5 of the present invention had minimum and average dielectric breakdown strengths of 100 kV/mm or more and were proved to be very good insulating substrates of electronic circuit boards. The uncolored liquid-crystal polymer film according to Comparative Example 6 had similar characteristics but had a high lightness (L*) of 76 just because of the absence of the black pigment and was a whitish insulating substrate.

Example 6 and Comparative Example 7

Preparation and Evaluation of Electronic Circuit Boards

A resist film was placed on a copper surface of the single-sided copper-clad laminates according to Example 5 and Comparative Example 6. A mask with a predetermined circuit layout was placed on the resist film and was irradiated with UV. An unnecessary portion of the resist film was then removed with an alkali. The exposed portion of copper was removed by etching with an iron (III) chloride aqueous solution. The resist film was removed by washing with water. After drying in a circulating oven at 80° C. for 1 hour, an electronic circuit board was obtained. The electronic circuit board was checked with an AOI apparatus for the circuit pattern, dimensions, and position.

In general, in AOI, when the difference in lightness between a copper circuit pattern and an insulating substrate is less than 30, the image recognition error percent cannot be 0%. Because the copper circuit pattern (copper foil S face) typically has a lightness of approximately 75, an insulating substrate for use in an electronic circuit board must have a lightness of 45 or less. The black liquid-crystal polymer film according to Example 5, which contained 0.5% by mass carbon black, had a lightness of 36 and a lightness difference of 39 from the copper circuit pattern, thus achieving an image recognition error percent of 0%. By contrast, the uncolored liquid-crystal polymer film according to Comparative Example 6, which contained no carbon black and had a lightness of 76, had an image recognition error percent of 10% in AOI and could not achieve an image recognition error percent of 0%.

In an electronic circuit board according to the present invention that includes a black liquid-crystal polymer film as an insulating substrate, a film portion exposed by etching reduces the reflection of light from the AOI apparatus and increases the contrast to a copper circuit pattern portion, thus achieving good pattern recognition.

By contrast, in an electronic circuit board that includes the uncolored liquid-crystal polymer film according to Comparative Example 6 as an insulating substrate, an film portion exposed by etching reflects light from the AOI apparatus and could not achieve a clear contrast to the copper circuit pattern portion. Thus, the copper circuit pattern could not be recognized.

An optical electronic component was then mounted on the prepared electronic circuit board and was checked for operational performance. As a result, in an electronic circuit board that includes the black liquid-crystal polymer film according to Example 5 as an insulating substrate, the substrate portion formed of the black liquid-crystal polymer film reflects less light. Thus, good operational performance was achieved without the effects of light reflected from the substrate portion.

An optical electronic component was mounted on an electronic circuit board including the uncolored liquid crystal polymer according to Comparative Example 6 and was checked for operational performance. A substrate portion formed of the uncolored liquid-crystal polymer film strongly reflected light. Thus, good results were not obtained because the optical component was significantly affected by light reflected from the substrate portion.

REFERENCE SIGNS LIST 1 black liquid-crystal polymer film
2 high-concentration spot of black pigment
3 circuit
4 interlayer connection conductor
5 multilayer board

The invention claimed is:

1. A black liquid-crystal polymer film comprising:
a black pigment; and
a liquid crystal polymer, wherein
an average primary particle size of the black pigment is 15 to 75 nm,
an amount of the black pigment is 0.1% to 5.0% by mass of the liquid crystal polymer,
the black liquid-crystal polymer film having a thickness of 10 μm to 75 μm, a lightness of 45 or less, a dielectric loss tangent of 0.0035 or less, a minimum dielectric breakdown strength of 60 kV/mm or more, and a maximum-to-minimum ratio of in-plane thermal linear expansion coefficient in the range of 1.0 to 2.5, and
wherein a high-concentration spot of the black pigment has a size of 9/10 or less of a film thickness of the black liquid-crystal polymer film.

2. The black liquid-crystal polymer film according to claim 1, wherein the black liquid-crystal polymer film has a relative permittivity of 3.5 or less.

3. The black liquid-crystal polymer film according to claim 1, wherein the black liquid-crystal polymer film has a thermal linear expansion coefficient in a range of 3 to 30 ppm/° C.

4. The black liquid-crystal polymer film according to claim 1, wherein the black liquid-crystal polymer film is a long film.

5. A laminated sheet comprising:
the black liquid-crystal polymer film according to claim 1; and
a metal foil on one or both faces of the black liquid-crystal polymer film.

6. An electronic circuit board comprising a circuit on the metal foil of the laminated sheet according to claim 5.

7. A multilayer board comprising two or more of the electronic circuit boards according to claim 6.

8. The multilayer board according to claim 7, further comprising an electronic device mounted on the circuit.

9. An electronic component comprising:
a mother board; and
the multilayer board according to claim 8 mounted on the mother board.

10. A black liquid-crystal polymer film comprising:
a black pigment; and
a liquid crystal polymer, wherein
an average primary particle size of the black pigment is 15 to 75 nm,
an amount of the black pigment is 0.1% to 5.0% by mass of the liquid crystal polymer,
a thickness of the black liquid-crystal polymer film is 10 μm to 75 μm, and
a number density of high-concentration spots of the black pigment with a size in the range of 3/10 to 9/10 of a film thickness of the black liquid-crystal polymer film is 15/342 mm$^2$ or less.

11. The black liquid-crystal polymer film according to claim 10, wherein the black liquid-crystal polymer film has a relative permittivity of 3.5 or less.

12. The black liquid-crystal polymer film according to claim 10, wherein the black liquid-crystal polymer film has a thermal linear expansion coefficient in a range of 3 to 30 ppm/° C.

13. The black liquid-crystal polymer film according to claim 10, wherein the black liquid-crystal polymer film is a long film.

14. A laminated sheet comprising:
the black liquid-crystal polymer film according to claim 10; and
a metal foil on one or both faces of the black liquid-crystal polymer film.

15. An electronic circuit board comprising a circuit on the metal foil of the laminated sheet according to claim 14.

16. A multilayer board comprising two or more of the electronic circuit boards according to claim 15.

17. The multilayer board according to claim 16, wherein in a side view, in the black liquid-crystal polymer film, the high-concentration spot of the black pigment between the two circuits disposed on both faces of the black liquid-crystal polymer film has a size of 9/10 or less of the shortest distance between the circuits.

18. The multilayer board according to claim 16, wherein in a top view a high-concentration spot of the black pigment disposed between the two circuits disposed on one face of the black liquid-crystal polymer film has a size of 9/10 or less of the shortest distance between the circuits.

19. The multilayer board according to claim 16, wherein in a side view a high-concentration spot of the black pigment disposed directly above and/or directly under the circuit has a size of ½ or less of the minimum width of the circuit.

20. The multilayer board according to claim 16, further comprising an electronic device mounted on the circuit.

21. An electronic component comprising:
   a mother board; and
   the multilayer board according to claim 16 mounted on the mother board.

* * * * *